TELEVISION HORIZONTAL OSCILLATOR AND AFC CIRCUIT

Filed June 24, 1966 2 Sheets-Sheet 1

INVENTORS
George A. Kent
Richard J. Waring
BY Pendleton, Neuman, Seibold & Williams
Attorneys INVENTORS
George A. Kent
Richard J. Waring
BY Pendleton, Neuman
Seibold & Williams
Attorneys United States Patent Office 3,497,620
Patented Feb. 24, 1970

3,497,620
TELEVISION HORIZONTAL OSCILLATOR AND AFC CIRCUIT

George A. Kent, Fort Wayne, and Richard J. Waring, Auburn, Ind., assignors to The Magnavox Company, Fort Wayne, Ind., a corporation of Delaware Filed June 24, 1966, Ser. No. 560,148
Int. Cl. H04l 7/02
U.S. Cl. 178—69.5 8 Claims

ABSTRACT OF THE DISCLOSURE

A horizontal oscillator and AFC circuit is disclosed which, in the preferred embodiment described, includes a transistorized blocking oscillator with a timing circuit having a variable capacitance solid state device included within a series resonant circuit coupled to the base and a thermistor in the oscillator load. An AFC voltage is applied to the device to control the frequency of the oscillator and the resonant circuit is used to sharpen the onset time of oscillator conduction. The thermistor compensates the timing circuit for changes in the temperature of the oscillator transistor.

This invention relates to an oscillator circuit operative at a frequency which is automatically controlled in response to a control signal applied thereto. The circuit of this invention uses solid state devices and is highly stable and reliable in operation while being very sensitive and while being economically manufacturable from a minimum number of component parts.

Although having other applications, the oscillator circuit of this invention is particularly designed for use as the horizontal oscillator of a television receiver to develop a signal which is applied to a horizontal output stage coupled to horizontal deflection coils, the oscillator being controlled in response to the phase difference between synchronizing pulses developed from a video signal and flyback pulses developed from the horizontal output stage during horizontal retrace intervals.

In circuits of the prior art, the output of a phase detector responsive to the synchronizing and flyback pulses has been applied to a blocking oscillator to control the bias level thereof and to thereby control the frequency of oscillation. Although such prior art circuits have been generally satisfactory, they have left much to be desired, particularly in the areas of stability and reliability.

This invention was evolved with the general object of overcoming the disadvantages of prior art circuits and of providing an oscillator circuit which is highly stable and reliable in operation and which is very sensitive to changes in the output of a phase detector or other control signal source.

A further object of this invention is to provide an oscillator circuit which is highly effective while being economically manufactured and which uses a minimum number of component parts.

Another object of this invention is to provide an oscillator circuit which is insensitive to variations in supply voltage, temperature and transistor parameters to achieve a high degree of stability.

According to this invention, a transistorized oscillator is provided having a timing circuit which includes a variable reactance solid state device to which a control signal is applied to control the reactance of the device and to control the frequency of operation of the oscillator. With this arrangement, the frequency of operation is highly sensitive to changes in the control signal, so that the frequency can be more rigidly and tightly controlled and so that the oscillator is considerably less senstive to variations in temperature, supply voltage and transistor parameters.

According to specific features of the invention, the solid state device has a capacitance controlled by the voltage thereacross, the device preferably being a reverse-biased semiconductor diode, and the device is connected in circuit with an inductor to form a tuned circuit having a resonant frequency which controls the frequency of oscillation of the oscillator. With these features, the sensitivity of the circuit is increased, and there is a minimum tendency to jump frequency modes with line voltage variations or control adjustments.

According to a further specific feature of the invention, the device is connected in series with the inductor to form a series resonant circuit which presents a low impedance to the oscillator circuit while the device presents a relatively high impedance to the phase detector or other source of control signal. This feature further increases the stability of operation and permits more accurate operation of the phase detector or other control signal source.

Additional features of the invention relate to the construction of the oscillator as a blocking oscillator and to the provision of a ramp circuit in the form of series-connected resistance and capacitance means, wherein the frequency of operation is determined by the combined effect of the ramp circuit and the tuned circuit. Preferably, the ramp circuit is adjusted to control the frequency obtained when a predetermined control signal is applied to the solid state device.

A further important feature of the invention relates to the provision of thermistor means arranged to load the oscillator and to control operation of timing circuitry thereof to stabiilze the frequency of operation of the oscillator. Preferably, a thermistor is connected between a secondary winding of a transformer of the oscillator and the base electrode of an amplifying transistor. With this arrangement, the resistance of the thermistor is reduced in response to increases in the output of the oscillator and operates through the transformer to control the reactance of the timing circuit of the oscillator to stabilize the frequency of operation.

This invention contemplates other and more specific objects, features and advantages which will become more fully apparent from the following detailed description taken in conjunction with the accompanying drawings which illustrate a preferred embodiment and in which.

Figure 1:
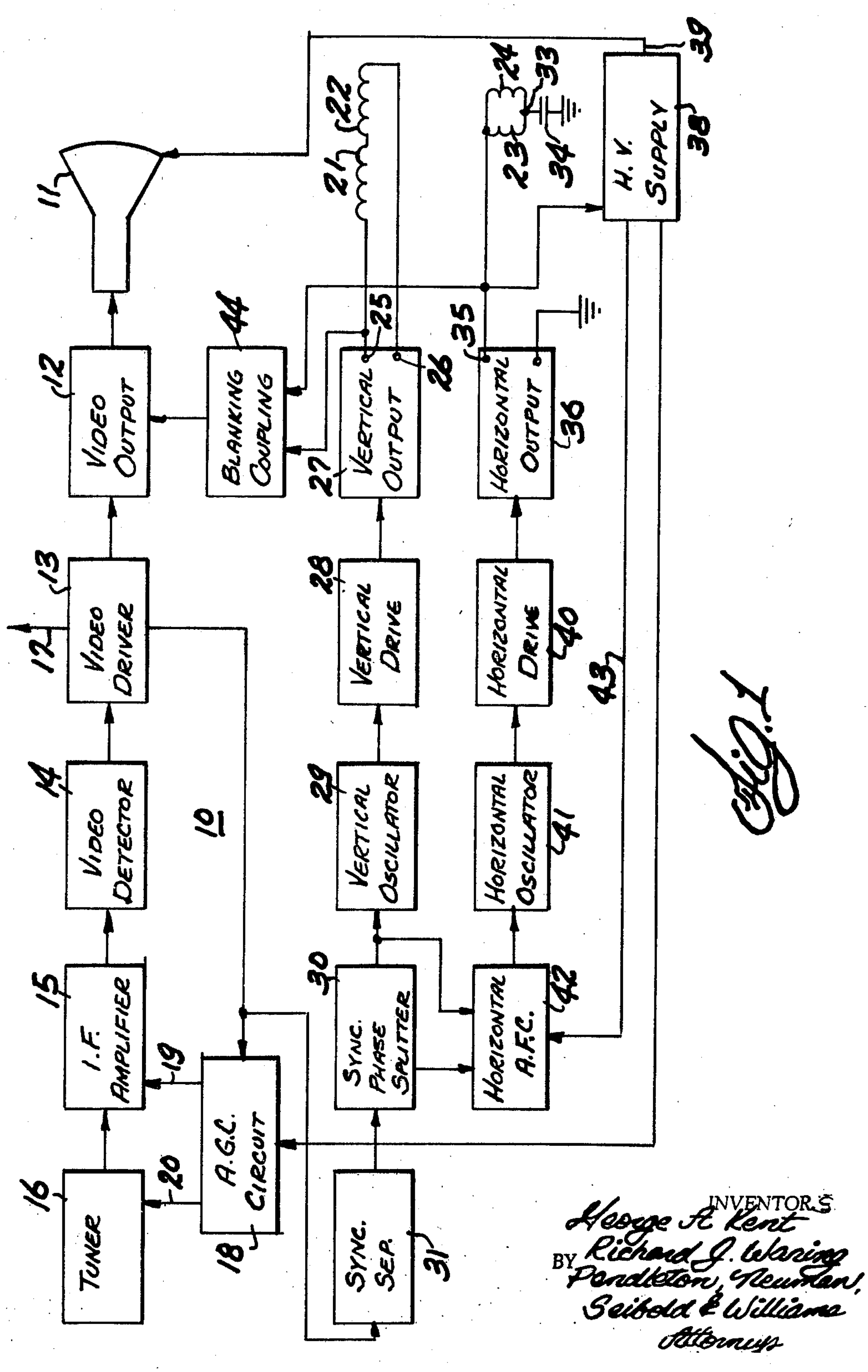
FIGURE 1 is a schematic block diagram of a television receiver constructed in accordance with the principles of this invention.

Reference numeral 10 generally designates a receiver constructed in accordance with the principles of this invention. The invention is particularly concerned with the circuit of a horizontal oscillator stage and circuits of a horizontal AFC stage and horizontal drive stage connected to the horizontal oscillator stage, but the overall construction of the receiver will be first described with reference to the block diagram of FIGURE 1.

The receiver 10 comprises a picture tube 11 having a conventional electron gun structure to which a video signal is applied from a video output stage 12, driven by a video driver stage 13, which receives a video signal from a video detector 14. The detector 14 receives a modulated signal from an IF amplifier 15 which, in turn, receives a modulated signal from a tuner 16. An output signal from the driver stage 13 may be applied through a line 17 to a sound channel (not shown) which may comprise a sound IF amplifier, a ratio detector, an audio amplifier and a sound reproducer or speaker.

Another output of the video driver stage 13 is applied to an automatic gain control circuit 18 which applies control voltage signals through lines 19 and 20 to the IF amplifier 15 and the tuner 16 to maintain the level of the detected video signal substantially constant.

To deflect the electron beam and to produce a raster on the screen of the picture tube 11, a pair of vertical deflection coils 21 and 22 and a pair of horizontal deflection coils 23 and 24 are provided. The vertical deflection coils 21 and 22 are connected to output terminals 25 and 26 of a vertical output stage 27 which operates to supply a sawtooth signal at the vertical repetition rate (normally 60 cycles per second). The output stage 27 has an input connected to the output of a driver stage 28, the driver stage 28 having an input connected to the output of a vertical oscillator 29. Oscillator 29 operates to supply a sawtooth signal which is synchronized with vertical synchronizing portions of the received signal, an input of the oscillator 29 being connected to the output of a synchronizing signal phase splitter circuit 30 which receives a signal from a synchronizing signal separator circuit 31, having an input connected to an output of the video driver stage 13. The synchronizing signal separator circuit 31 operates to develop pulses in response to synchronizing pulse portions of the video signal developed by the detector 14.

The invention is particularly concerned with the horizontal deflection system. In this system, the horizontal deflection coils 23 and 24 are connected in parallel between a circuit point 33, connected through a capacitor 34 to ground, and an output terminal 35 of a horizontal output stage 36. Output terminal 35 is also connected to a high voltage supply 38 which supplies a high voltage to the screen of the picture tube 11, through a line 39. The horizontal output stage 36 is driven through a horizontal driver stage 40 from a horizontal oscillator stage 41 which is controlled by a horizontal automatic frequency control stage 42. One input of stage 42 is connected to receive a flyback pulse through an output line 43 of the high voltage supply 38. A pair of inputs of the stage 42 are connected to outputs of the synchronizing signal phase splitter stage 30.

It is here noted that although it does not form a part of the present invention, by itself, a blanking signal coupling circuit 44 is provided having a pair of inputs connected to terminals 25 and 35 of the vertical and horizontal output stages 27 and 36 and having an output connected to the video output stage 12, for the purpose of blanking the picture tube 11 during retrace intervals.

Figures 2, 3:
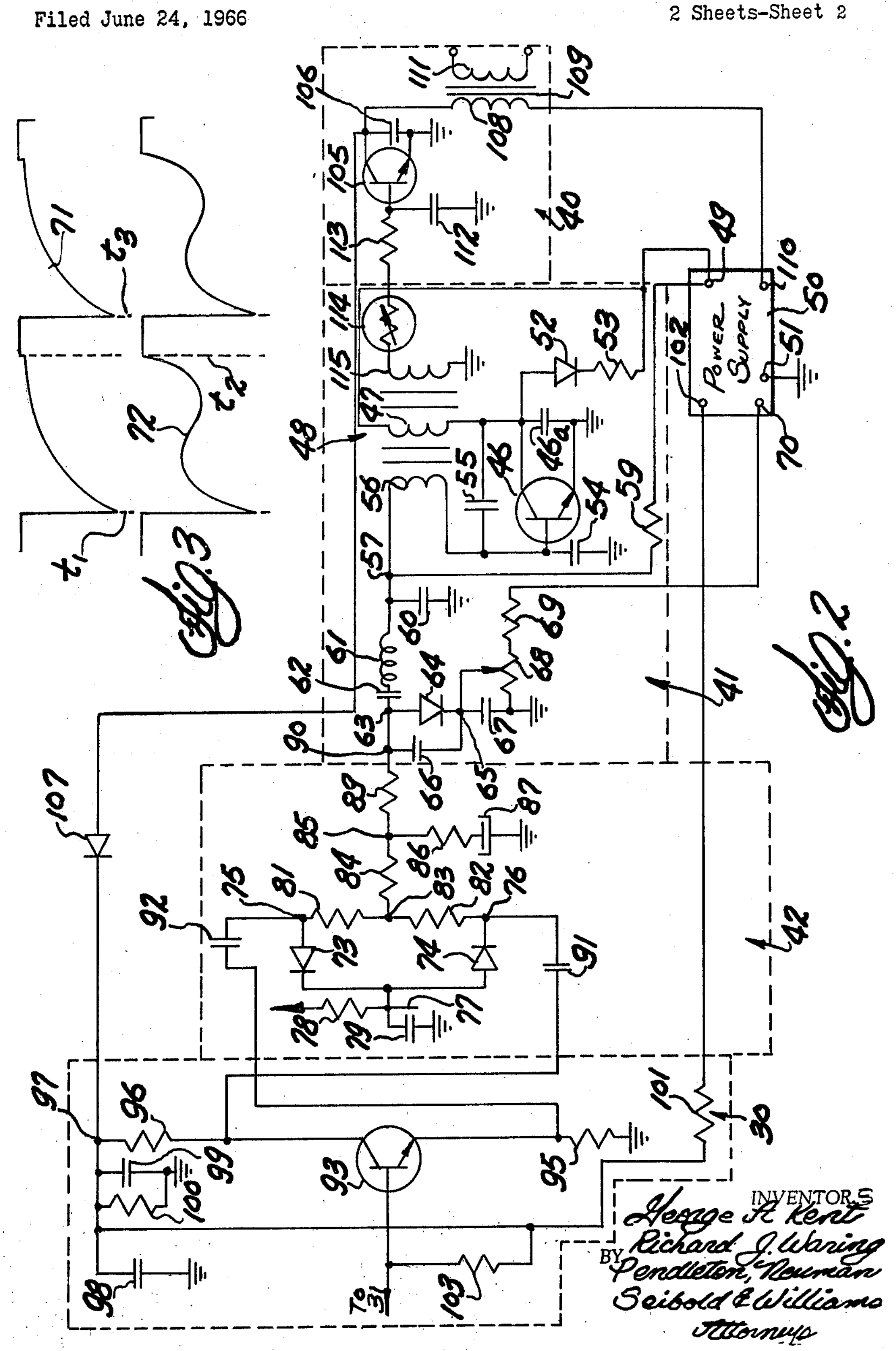
FIGURE 2 is a circuit diagram showing the circuits of a synchronizing signal phase splitter stage, a horizontal AFC stage, a horizontal oscillator stage and a horizontal drive stage of the receiver of FIGURE 1.
FIGURE 3 is a view showing wave forms produced at the base of a transistor of the horizontal oscillator stage under certain conditions, for explanation of the operation thereof.

FIGURE 2 shows the circuits of the synchronizing signal phase splitter stage 30, the horizontal AFC stage 42, the horizontal oscillator stage 41 and the horizontal drive stage 40. The horizontal oscillator stage 41 comprises a transistor 46 operated as a blocking oscillator, having an emitter electrode connected to ground and a collector electrode connected through a capacitor 46*a* to ground and through a primary winding 47 of a transformer 48 to a terminal 49 of a power supply 50 having a terminal 51 connected to ground. The terminal 49 may supply a voltage of plus 12 volts relative to ground, by way of example. A diode 52 is connected in series with a resistor 53 across the winding 47.

The base of the transistor 46 is connected through a capacitor 54 to ground, through a capacitor 55 to the collector thereof, and through a secondary winding 56 of the transformer 48 to a circuit point 57 which is connected through a resistor 59 to the power supply terminal 49, and through a capacitor 60 to ground. Circuit point 57 is additionally connected through an inductor 61 and a capacitor 62 to a circuit point 63, forming a control signal input terminal of the oscillator 41, circuit point 63 being connected to the output of the AFC stage 42.

In accordance with this invention, the circuit point 63 is connected through a variable reactance solid state device 64 to a circuit point 65 operated at a fixed voltage relative to ground, the device 64 preferably being a reverse-biased diode having a capacitance controlled by the voltage thereacross. A capacitor 66 may desirably be connected in parallel with the device 64.

To develop a reference voltage at the circuit point 65, it is connected through a bypass capacitor 67 to ground and is directly connected to the movable contact of a potentiometer 68 having one terminal connected to ground and having its other terminal connected through a resistor 69 to an output terminal 70 of the power supply 50. The terminal 70 may be at a potential of plus 12 volts relative to ground, by way of example.

In the operation of the circuit as thus far described, a forward bias is applied to the transistor 46 such that when supply voltages are initially applied, the collector current of the transistor 46 will increase. The increasing current flows through the primary winding 47 and induces a voltage in the winding 56 which has a positive polarity at the end thereof which is connected to the base of the transistor 46. As a result, the transistor 46 rapidly goes into saturation conduction. During this action, a pulse of relatively high amplitude is developed in the winding 56 to develop certain charges across the capacitors 60, 62 and 66, the diode 64 being nonconductive at this time so that a charge is developed between circuit points 63 and 65. When the transistor 46 becomes saturated, the collector current thereof ceases to change and the field in the transformer windings becomes steady. This reduces the base current of transistor 46 and voltages are then induced across the windings 47 and 56 of reversed polarity and the diode 52 becomes conductive to dissipate the energy stored in the transformer 48.

The capacitors 60 and 62, however, remain charged and through the winding 56 a potential is applied to the base of the transistor 46 to cut off conduction thereof. The capacitors 60 and 62 then discharge toward the supply voltage. At the same time, there is a ringing action obtained from a tuned series resonant circuit formed by the inductor 61, the capacitor 62 and the combination of the diode 64 and the capacitor 66. Through the ringing action, the potential of the base of the transistor 46 moves in a positive direction then back in a negative direction and then again in a positive direction and finally reaches a potental above ground potential to trigger the transistor 46 into conduction, thereby repeating the cycle.

This operation is indicated graphically in FIGURE 3. Reference numeral 71 shows the waveform obtained at the base of the transistor 46 with a short applied across the inductor 61. At time $t_1$, following conduction of the transistor 46, the base potential swings negative. Then at a rate determined by the time constant of the circuit (which may be computed from the values of the capacitors and resistors of the circuit), the voltage moves toward ground potential and finally at a time $t_2$ the potential is such that the transistor 46 starts to conduct. Then at a time $t_3$, after the transistor 46 becomes saturated, the potential of the base of the transistor 46 again moves highly negative, repeating the cycle.

Curve 72 in FIGURE 3 is obtained with the short circuit across the inductor 61 removed. Here again, the potential of the base transistor 46 moves highly negative at time $t_1$, but, as shown, it moves more rapidly in a positive direction, then back in a negative direction and finally moves rapidly in a positive direction such that at time $t_2$, the base potential becomes positive to initiate conduction of the transistor 46.

The controlling portion of the waveform 72 may be considered as being the summation of a ramp component corresponding to the waveform 71 plus an oscillatory component produced by ringing action of the series resonant circuit formed by inductor 61, capacitor 62, diode 64 and capacitor 66. The rise of the ramp component is controlled by the value of the supply voltage applied to the circuit and the RC time constant of the circuit, while the oscillatory component is controlled by the product of the inductance of the inductor 61 and the combined capacitance of capacitor 62, diode 64 and capacitor 66. The oscillatory component has a very rapid rate of change in the region of the trigger point $t_2$ and thus provides precise control of the exact time at which conduction of the transistor 46 is initiated. Since the capacitance of the diode 64 is controlled by the control signal applied to circuit point 63, both the transient decay time and the oscillatory frequency are very sensitive to changes in the control voltage, and relatively insensitive to changes in the supply voltage or in other operating conditions and parameters. The tendency to jump modes with line voltage variations or control adjustments is minimized. Further, it will be noted that the adjustment of the oscillator frequency has a negligible effect on the retrace time (between times $t_2$ and $t_3$). Another advantage is that the circuit has excellent noise immunity because the base-to-ground capacitance can be quite large. Still another advantage is that the circuit permits the use of a very low cost transistor because of efficient operation and low power requirements.

A still further advantage of the circuit is that the tuned ringing circuit is series resonant to present a very low impedance in the base circuit of the transistor 46, while the diode 64 presents a relatively high impedance to the AFC stage 42, and permits a direct connection thereto.

The illustrated AFC circuit comprises a pair of diodes 73 and 74 connected between circuit points 75 and 76 and a circuit point 77 which is connected through a resistor 78 to the flyback pulse line 43 and through a capacitor 79 to ground. Circuit points 75 and 76 are connected through resistors 81 and 82 to a circuit point 83 which is connected through a resistor 84 to a circuit point 85. Circuit point 85 is connected to ground through a resistor 86 and a capacitor 87 and connected through a resistor 89 to the circuit point 90.

The circuit points 75 and 76 are additionally connected through capacitors 91 and 92 to the emitter and collector electrodes of a transistor 93 in the phase splitter stage 30, the emitter electrode being connected to ground through a resistor 95 and the collector electrode being connected through a resistor 96 to a circuit point 97. Circuit point 97 is connected to ground through capacitors 98 and 99 and resistor 100 and is connected through a resistor 101 to a terminal 102 of the power supply 50. The base electrode of the transistor 93 is connected through a resistor 103 to the circuit point 97 and is connected to the output of the synchronizing signal separator circuit 31.

In operation, positive-going synchronizing pulses are applied to the base electrode of the transistor 93 to render the transistor conductive and to develop positive-going and negative-going signals at the emitter and collector electrodes thereof, which are applied through the capacitors 91 and 92 to render both of the diodes 73 and 74 conductive. The flyback pulse on line 43 is shaped by the action of the resistor 78 and capacitor 79 and the average potential of the circuit point 83 is either increased or decreased, depending upon the phase relation of the flyback pulses to the synchronizing pulses. The diodes 73 and 74 and associated circuitry thus function as a phase detector.

The signal so developed at the circuit point 83 is applied through the resistors 84 and 89 to the diode 64 to control the capacitance thereof and to control the frequency of operation of the oscillator 41.

Because of the high degree of sensitivity of the oscillator circuit 41 to changes in the control signal, the operation of the oscillator 41 is tightly locked to the proper frequency, so as to achieve an extremely high degree of stability.

The driver stage 40 comprises a transistor 105 having an emitter connected to ground and having a collector which is connected through a capacitor 106 to ground, through a diode 107 to the circuit point 97 and through a primary winding 108 of a coupling transformer 109 to a terminal 110 of the power supply 50. The transformer 109 has a secondary winding 111 coupled to the input of the output stage 36.

The base electrode of transistor 105 is connected to ground through a capacitor 112 and is connected through a resistor 113 and a thermistor 114 to one terminal of a winding 115 of the transformer 48, the other terminal of winding 115 being connected to ground.

With this circuit, output pulses of the oscillator 41, developed across the winding 115 during conduction of the transistor 46 are applied through the thermistor 114 and resistor 113 to the base of the transistor 105 to render the transistor 105 highly conductive, thereby developing a signal in the secondary winding 111 of transformer 109 which is applied to the horizontal output stage 36.

The thermistor 114 forms an important feature of the invention, in compensating for temperature changes within the oscillator transistor 46 and in stabilizing the frequency of operation. When the temperature of the transistor 46 changes, the collector current and the frequency of oscillation will change. The collector current increase is reflected in an increase in the current through the thermistor 114 which causes the resistance of the thermistor to decrease. This produces a heavier load across the secondary winding 115 and causes a small change in the effective inductance of the winding 56. The change in inductance is in a direction such as to correct the frequqeqncy drift of the oscillator and also to stabilize the collector current.

By way of illustrative example and not by way of limitation, the components in the circuit may have values according to the following table:

| Reference numeral: | | Value |
|---|---|---|
| **46*a*** | picofarads | 2200 |
| **53** | ohms | 2700 |
| **54** | picofarads | 220 |
| **55** | do | 82 |
| **59** | ohms | 68,000 |
| **60** | picofarads | 470 |
| **62** | do | 470 |
| **66** | do | 390 |
| **67** | microfarads | 0.47 |
| **68** | ohms | 25,000 |
| **69** | do | 82,000 |
| **78** | do | 8200 |
| **79** | microfarads | 0.01 |
| **81** | ohms | 47,000 |
| **82** | do | 47,000 |
| **84** | do | 47,000 |
| **86** | do | 4700 |
| **87** | microfarads | 1 |
| **89** | ohms | 47,000 |
| **91** | picofarads | 1000 |
| **92** | do | 1000 |
| **95** | ohms | 1800 |
| **96** | do | 1800 |
| **98** | picofarads | 1000 |
| **99** | microfarads | 8 |
| **101** | ohms | 82,000 |
| **103** | do | 220,000 |
| **106** | picofarads | 680 |
| **112** | do | 1000 |
| **113** | ohms | 68 |

The nominal capacitance of the diode 64 may be on the order of 220 picofarads. The power supply 50 may supply voltages of 12 volts, 68 volts and 14.5 volts at the terminals 49 and 70, 102 and 110, respectively.

The thermistor 114 may have a nominal resistance of approximately 50 ohms.

It will be understood that modifications and variations may be effected without departing from the spirit and scope of the novel concepts of this invention.

We claim as our invention:

1. In a deflection circuit, a transistorized oscillator having a timing circuit including a variable reactance solid state device having a capacitance controlled by the voltage thereacross and additional circuit means including an inductor cooperating with said solid state device to form a tuned circuit having a resonant frequency which controls the oscillatory frequency of said oscillator and provides an oscillatory component in a signal determining the time of conduction onset of said oscillator and means for applying a control signal to said solid state device to control the reactance thereof and to control the frequency of operation of said oscillator.

2. In a deflection circuit, a transistorized oscillator having a timing circuit, said timing circuit including a variable reactance solid state device having a capacitance controlled by the voltage thereacross and an inductor cooperating with said solid state device to form a series resonant circuit having a resonant frequency which controls the oscillatory frequency of said oscillator, and means for applying a control signal to said solid state device to control the reactance thereof, said series resonant circuit being operative to present a low impedance to said oscillator circuit while said device presents a relatively high impedance to said control signal applying means.

3. In a deflection circuit:

a transistorized oscillator having a timing circuit including:

- a variable reactance solid state device having a capacitance controlled by the voltage thereacross;

an inductor cooperating with said solid state device to form a tuned circuit having a resonant frequency which controls the oscillatory frequency of said oscillator;
- a ramp circuit comprising capacitance means periodicaly charged to a certain value, resistance means in series with said capacitance means to form a series RC circuit, and means for applying a supply voltage to said RC circuit, whereby the charge of said capacitance means is gradually changed at a rate determined by the magnitude of said supply voltage and the RC time constant of said RC circuit, the frequency of operation of said oscillator being determined by the combined effect of said ramp circuit and said tuned circuit;
- means for adjusting said ramp circuit to control the frequency obtained when a predetermined control signal is applied to said solid state device; and means for applying a control signal to said solid state device.

4. In a deflection circuit an oscillator including a transistor, a timing circuit including a variable reactance solid state device and additional circuit means to provide an oscillatory component in a signal determining the time of conduction onset of said oscillator, and circuit means associated with said transistor to effect conduction of large amplitude current pulses through said transistor and to then block conduction of said transistor, said timing circuit being arranged to respond to each current pulse through said transistor to trigger said transistor into conduction after a time interval controlled by said control signal, and means for applying a control signal to said solid state device to control the reactance thereof and to control the frequency of operation of said oscillator.

5. In a deflection circuit, a transistorized oscillator having a timing circuit, said timing circuit including a variable reactance solid state device, thermistor means arranged to load said oscillator and to control operation of said timing circuit to stabilize the frequency of operation of said oscillator, and means for applying a control signal to said solid state device to control the reactance thereof and to control the frequency of operation of said oscillator.

6. In a deflection circuit, an oscillator including a timing circuit, said timing circuit having a variable reactance solid state device, a transistor, and a transformer having a primary winding coupled to said transistor, a first secondary winding coupled to said timing circuit and a second secondary winding, an amplifier stage including a second transistor having base, emitter and collector electrodes, and a thermistor coupled between said second secondary winding and said base electrode of said second transistor, the resistance of said thermistor being reduced in response to increased current therethrough to control the effective reactance of said first secondary winding and to control the operation of said timing circuit to stabilize the frequency of operation of said oscillator, and means for applying a control signal to said solid state device to control the reactance thereof and to control the frequency of operation of said oscillator.

7. In a deflection circuit, an oscillator including a transistor having base, emitter and collector electrodes, D.C. power supply means, means connecting said emitter electrode to said D.C. power supply means, a transformer having primary and secondary windings, means connecting said primary winding between said collector electrode and said D.C. power supply means, a timing circuit having a variable reactance solid state device and additional circuit means to provide an oscillatory component in a signal determining the time of conduction onset of said oscillator, and means connecting said timing circuit and said secondary winding in circuit with said D.C. power supply means and said base electrode for periodically rendering said transistor highly conductive and to then block conduction of said transistor, said timing circuit being operative to trigger said transistor into conduction after a time interval determined by the reactance of said variable reactance solid state device, and means for applying a control signal to said solid state device to control the reactance thereof and to control the frequency of operation of said oscillator.

8. In a television receiver including a picture tube, detector means for developing a video signal, amplifier means for applying said video signal to said picture tube, a synchronizing signal separator circuit for responding to said video signal for developing synchronizing pulses, horizontal and vertical deflection means for said picture tube, a vertical deflection circuit controlled by said synchronizing pulses for controlling said vertical deflection means, a horizontal deflection output stage for controlling said horizontal deflection means and for developing flyback pulses during horizontal retrace intervals, a phase detector for responding to said flyback pulses and said synchronizing pulses to develop a control signal varying in direction and magnitude with variations in the direction and magnitude of phase differences between said synchronizing pulses and said flyback pulses, an oscillator controlled by said control signal, and means coupling said oscillator to said horizontal output stage, said oscillator comprising a timing circuit including a solid state device having capacitance controlled by the voltage thereacross and an inductor in series with said device to form a low impedance timing circuit controlling the oscillatory frequency of said oscillator, and means applying said control signal from said phase detector across said solid state device to control the capacitance thereof, said device presenting a relatively high impedance to said control signal.

References Cited

UNITED STATES PATENTS

| | | | |
|---|---|---|---|
| 3,209,278 | 9/1965 | Binkis | 331—20 |
| 3,370,123 | 2/1968 | Gassmann | 178—7.3 |

OTHER REFERENCES

Towers: Transistor Television Receivers, pp. 133–135, 1963.

ROBERT L. GRIFFIN, Primary Examiner

R. L. RICHARDSON, Assistant Examiner

U.S. Cl. X.R.

178—7.3; 331—20, 36, 148, 149